United States Patent
Hsu et al.

(10) Patent No.: US 6,303,502 B1
(45) Date of Patent: Oct. 16, 2001

(54) MOCVD METAL OXIDE FOR ONE TRANSISTOR MEMORY

(75) Inventors: Sheng Teng Hsu, Camas, WA (US); David R. Evans, Beaverton, OR (US); Tingkai Li, Vancouver, WA (US); Jer-shen Maa, Vancouver, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/588,940

(22) Filed: Jun. 6, 2000

(51) Int. Cl.⁷ .................. H01L 21/44; H01L 21/8242
(52) U.S. Cl. .................. 438/680; 438/239; 438/240; 438/250; 438/393; 438/396
(58) Field of Search .................. 438/680, 3, 393, 438/396, 239, 250, 253, 455, 458, 785, 240, 710, 666, 151, 257, 643, 624, 659, 535

(56) References Cited

U.S. PATENT DOCUMENTS

| | | | |
|---|---|---|---|
| 5,008,687 | 4/1991 | Longman et al. | 346/135.1 |
| 5,612,082 * | 3/1997 | Azuma et al. | 427/96 |
| 5,708,284 | 1/1998 | Onishi | 257/295 |
| 5,739,563 * | 4/1998 | Kawakubo et al. | 257/295 |
| 5,793,057 | 8/1998 | Summerfelt | 257/55 |
| 5,796,648 * | 8/1998 | Kawakubo et al. | 365/145 |
| 5,854,107 | 12/1998 | Park et al. | 438/254 |
| 5,986,301 * | 11/1999 | Fukushima et al. | 257/306 |
| 6,011,285 * | 1/2000 | Hsu et al. | 257/295 |
| 6,242,298 * | 6/2001 | Kawakubo | 438/239 |
| 6,242,771 * | 6/2001 | Hsu et al. | 257/295 |

OTHER PUBLICATIONS

Article entitled, "Processing of a Uniaxial Ferroelectric $Pb_5Ge_3O_{11}$ Thin Film at 450°C. with C–Axis Orintation", by J.J. Lee and S.K. Dey, published in Appl. Phys. Lett. 60 (2), May 18, 1992, pp. 2487–2488.

Article entitled, "Ferroelectric and Optical Properties of $Pb_5Ge_3O_{11}$ and its Isomorphous Compound $Pb_5Ge_3SiO_{11}$", by H. Iwasaki, S. Miyazawa, H. Koizumi, K. Sugii & N. Niizeki, published in J. Appl. .Phys., vol. 43, No. 12, Dec. 1972, pp. 4907–4915.

(List continued on next page.)

*Primary Examiner*—Matthew Smith
*Assistant Examiner*—Iguse U. Anya
(74) *Attorney, Agent, or Firm*—David C. Ripma; Matthew D. Rabdau; Scott C. Krieger

(57) ABSTRACT

A method of fabricating a one-transistor memory includes, on a single crystal silicon substrate, depositing a bottom electrode structure on a gate oxide layer; implanting ions to form a source region and a drain region and activating the implanted ions spin coating the structure with a first ferroelectric layer; depositing a second ferroelectric layer; and annealing the structure to provide a c-axis ferroelectric orientation.

7 Claims, 5 Drawing Sheets

OTHER PUBLICATIONS

Article entitled, Electro–optic Properties of Ferroelectric $5PbO$—$3GeO_2$ Single Crystal, by N. Uchida, T. Saku, H. Iwasaki & K. Onuki, pulished in J. Appl. Phys., vol. 43, No. 12, Dec. 1972, pp. 4933–4936.

Article entitled, "Oriented Lead Germanate Thin Films by Eximer Laser Ablation", by C.J. Peng, D. Roy and S.B. Krupanidhi, published in Appl. Phys. Lett. 60 (7), Feb. 17, 1992, pp. 827–829.

Article entitled, Evolution of Ferroelectricity in Ultrafine–grained $Pb_5Ge_3O_{11}$ Crystallized from the Glass, by A.M. Glass, K. Nassau & J.W. Shiever, published in J. Appl. Phys. 48(12) Dec. 1977, pp. 5213–5216.

Article entitled $5PbO$–$3GeO_2$ Crystal; A New Ferroelectric, by H. Iwasaki, K. Sugii, T. Yamada & N. Niizeki, published in Appl. Phys., vol. 18, No;. May 10, 15, 1971, pp. 444–445.

Article entitled, Elastic and Piezoelectric Properties of Ferroelectric $5PbO$—$3GeO_2$ Crystals, by T. Yamada, H. Iwasaki & N. Niizeki, published in J. Appl. Phys. vol. 43, No. 3, Mar. 1972, pp. 771–775.

Article entitled Electrical and Structural Properties of Flash–Evaporated Ferroelectric Lead Germanate Films on Silicon, by A. Mansigh & S.B. Krupanidni, published in Thin Solid Films,80(1981) pp. 359–371.

Article entitled, Preparation and Properties of Thermally Evaporated Lead Germanate Films, by A. Mansingh & S.B. Krupanidhi, published in J. Appl. Phys. 51(10), Oct. 1980, pp. 5408–5412.

Article entitled, "Improvement of Ta Diffusion Barrier Performance in Cu Metallization by Insertion of a Thin Zr layer into Ta film", by Kwak et al., published in 1998 American Institute of Physics, vol. 72, #22, pp 2832–2833.

Article entitled, "Investigation of Tr/Ta Diffusion Barrier Using Hybrid Conductive Oxide ($PuO2$) for High Dielectric application", by D–D Yoon, published in 1998 American Vacuum Society, J. Vac. Sci. Technol. B 16(3), May/Jun. 1998, pp. 11371141.

Article entitled, "Oxidation Resistance of Tantalum–Ruthenium Dioxide Diffusion Barrier for Memory Capacitor Bottom Electrodes", by D–S Yoon et al., published by 19989 American Institute of Physics, Applied Physics Letters, vol. 73, No. 3, 2 Jul. 1998, pp. 324–326.

Article Entitled, "Oxide ($CeO2$)–Incorporated New Diffusion Barrier for Cu Metallization" by D–S Yoon et al., published in Conference Proceedins ULSI XIII, 1998 Materials Research Society, pp. 103–109.

* cited by examiner

MOCVD METAL OXIDE FOR ONE TRANSISTOR MEMORY

RELATED APPLICATIONS

This application is related to: (1) A Method and System for Metalorganic Chemical Vapor Deposition (MOCVD) and Annealing of Lead Germanate (PGO) Thin Films, Ser. No. 09/489,857, filed Jan. 24, 2000; (2) Multi-phase Lead-Germanate Film and Deposition Method, Ser. No. 09/301,420, filed Apr. 24, 1999; (3) Epitaxially Grown Lead Germanate Film and Deposition Method, Ser. No. 09/302,272, Filed Apr. 24, 1999; (4) Ferroelastic Lead Germanate Film and Deposition Method, Ser. No. 09/301,434, Apr. 24, 1999; (5) Composite Iridium-Metal Oxygen Barrier Structure with Refractory Metal Companion Barrier and Method, Ser. No. 09/316,661, filed May 12, 1999; and (6) Composite Barrier Structure with Oxidized Refractory Metal Companion Barrier and Method for Same, Ser. No. 09/316,646, filed May 12, 1999.

FIELD OF THE INVENTION

This invention relates to very large scale and embedded non-volatile memory circuit, and specifically to the manufacture of a memory device using metal organic chemical vapor deposition (MOCVD) by providing a uniform MOCVD seed.

BACKGROUND OF THE INVENTION

Many single transistor ferroelectric memory devices, such as MFMOS, MFOS, MFMS, have been proposed, however, a single transistor memory integrated circuit has not been fabricated. This is because of the difficulty of depositing an appropriate ferroelectric material. Ferroelectric material may be deposited by spin-coating or metal organic chemical vapor deposition (MOCVD) techniques. The MOCVD technique has better composition control and better step coverage, and is more suitable for device application. However, the MOCVD deposition rate strongly depends on the nucleation formation. The density of nucleation seed also affects the morphology of the MOCVD thin film.

SUMMARY OF THE INVENTION

A method of fabricating a one-transistor memory, includes preparing a single crystal silicon substrate; forming a device area on the substrate; growing a gate oxide layer on the surface of the substrate; depositing a bottom electrode structure on the gate oxide layer; implanting ions to form a source region and a drain region and activating the implanted ions; spin coating the structure with a first ferroelectric layer having a thickness of between about 5 nm and 100 nm; depositing a second ferroelectric layer to a thickness of between about 50 nm and 300 nm; annealing the structure to prove ferroelectric c-axis orientation; etching the stricture to remove excess ferroelectric material; depositing a protective layer; depositing a layer of silicon oxide; and metallizing the structure.

It is an object of this invention to provide a uniform seed for MOCVD metal oxide ferroelectric thin film formation.

Another object of the invention is to provide an uniform seed on silicon wafer with device isolation and metal electrodes for MOCVD of ferroelectric material for single transistor memory device fabrication.

DETAILED DESCRIPTION OF THE PREFERRED EMBODIMENT

Figure 1:
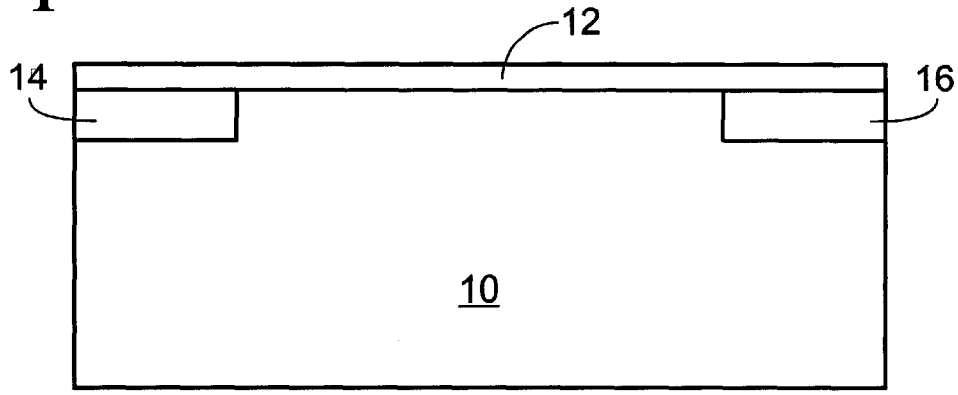
FIGS. 1 to 10 depict successive steps in the fabrication of a single transistor memory device according to the invention.

The fabrication of a device according to the invention begins, as shown in FIG. 1, with the preparation of a single crystal silicon substrate 10, which is treated with state-of-the-art processes for well formation, shallow trench isolation (STI) or local oxidation of silicon (LOCOS) device isolation to form a device area, and gate oxide layer 12 growth for metal-ferro-metal metal oxide semiconductor (MFMOS) transistor. Insulator regions 14, 16 are formed about the periphery of the device area. In the case where the device to be formed is a metal-ferro-metal semiconductor (MFMS) transistor, there is no need to grow the gate oxide. It is assumed, for the first embodiment of the invention, that the bottom electrode is a plasma etchable material and is a high temperature electrode which is able to sustain the source/drain annealing and activation temperature.

Figure 2:
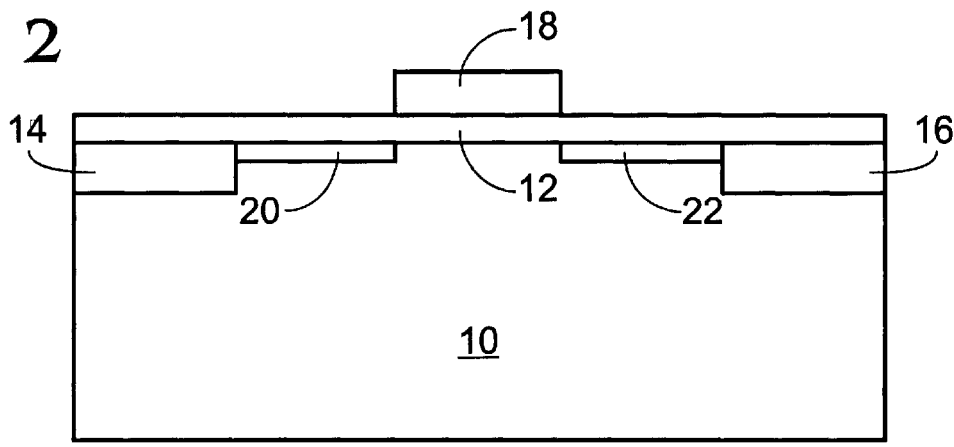

A bottom electrode layer 18 is deposited on the device area to a thickness of between 50 nm and 300 nm by plasma vapor deposition (PVD) or chemical vapor deposition (CVD) of platinum, iridium, or multi-layer structure with platinum or iridium formed on top of a metal nitride, such as TiN, TaN or TiTaN, at a temperature of between 200° C. and 250° C., in an argon or nitrogen atmosphere at about $1 \cdot 10^{-6}$ torr. pressure. Photoresist is applied and the layer etched to provide the bottom electrode topology, after which, the resist is stripped. Source region 20 and drain region 22 are formed by implanting appropriate ions in the device area to form two $n^+$ regions. Appropriate ion implantation in this instance may be the implantation of As ions at a preferred energy of about 50 keV, although implantation in a range of 40 keV to 90 keV is acceptable, and a dosing in a range of $2 \cdot 10^{15}$ cm$^{-2}$ to $5 \cdot 10^{15}$ cm$^{-2}$. Alternately, phosphorus ions may be implanted in an energy range of 300 keV–60 keV in the same dosing range. The structure is annealed at a temperature of between 700° C. and 950° C. at ambient pressure in an argon or nitrogen atmosphere to activate the implanted ions in the source region and the drain region, resulting in the structure shown in FIG. 2.

Figure 3:
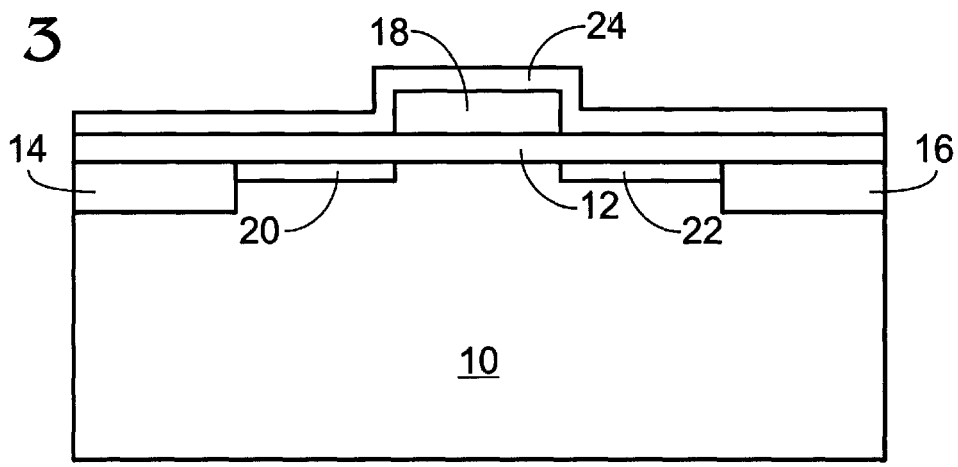

A thin layer of lead germanium oxide (PGO: $Pb_5Ge_3O_{11}$ or $Pb_3GeO_5$) 24, or other suitable ferroelectric material, such as $SrBi_2Ta_2O_9$ (SBT) or $Pb(Zr,Ti)O_3$ (PZT), is deposited by spin-coating. The thickness of this layer is between 5 nm and 100 nm, with a preferred thickness of less than 10 nm. The structure is again annealed, this time at a temperature between 400° C. to 550° C., to properly orient the spin-coated PGO film, as shown in FIG. 3. The PGO thin film is annealed to provide a c-axis orientation.

Figure 4:
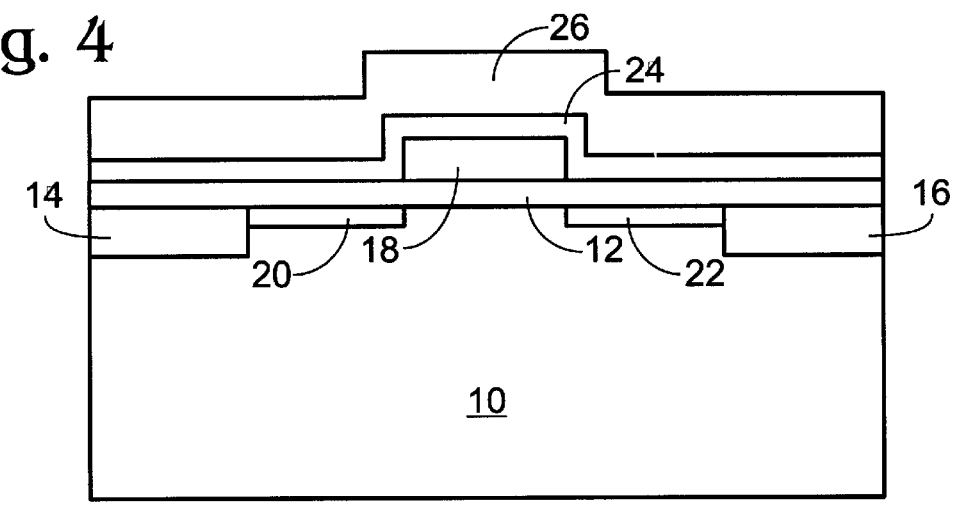

Referring now to FIG. 4, another PGO layer 26, or other ferroelectric thin film, is uniformly deposited on layer 24 by MOCVD to desired thickness of between 50 nm to 300 nm. This layer is deposited at a temperature of 350° C. to 550° C. in an oxygen atmosphere at a pressure of between 1 and 110 torr. Layer 26 is physically indistinguishable from layer 24 when the process is completed.

Figure 5:
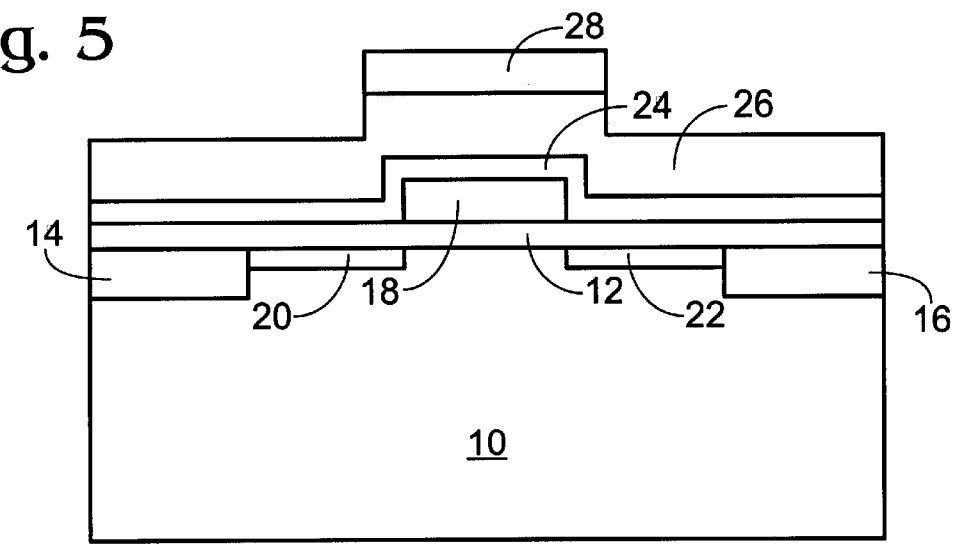

A top electrode layer 28 of platinum is next deposited by sputtering, as shown in FIG. 5. Layer 28 is etched to form the structure as depicted in FIG. 5. Alternately, the PGO or the ferroelectric thin film layer may also be etched at this point, resulting in the structure shown in FIG. 6.

Figure 6:
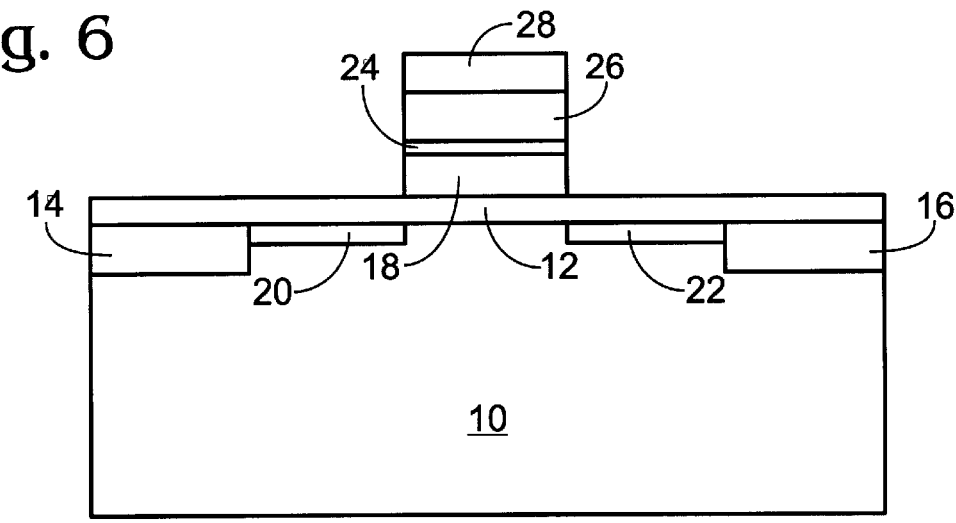
Figure 7:
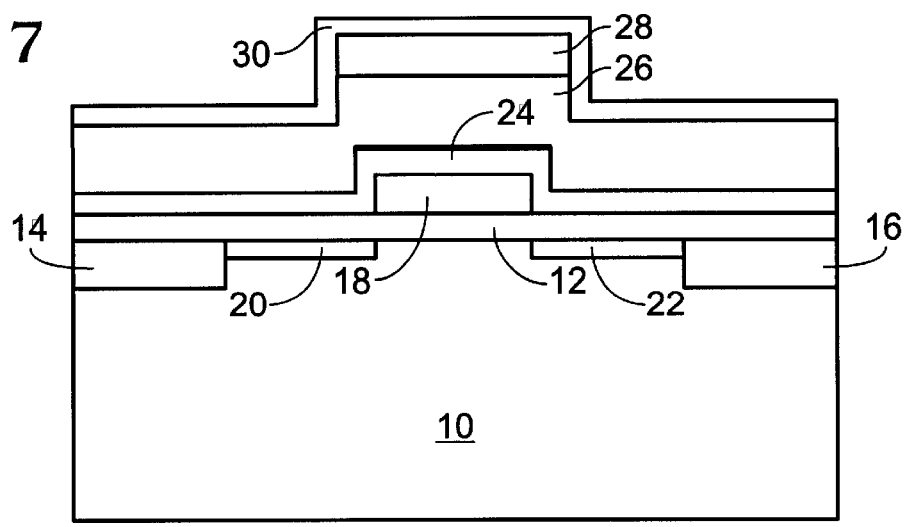
Figure 8:
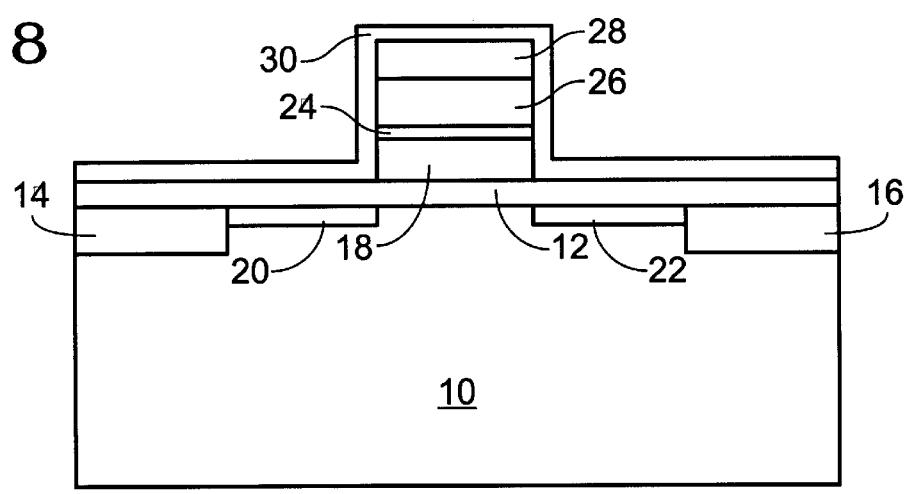
Figure 9:
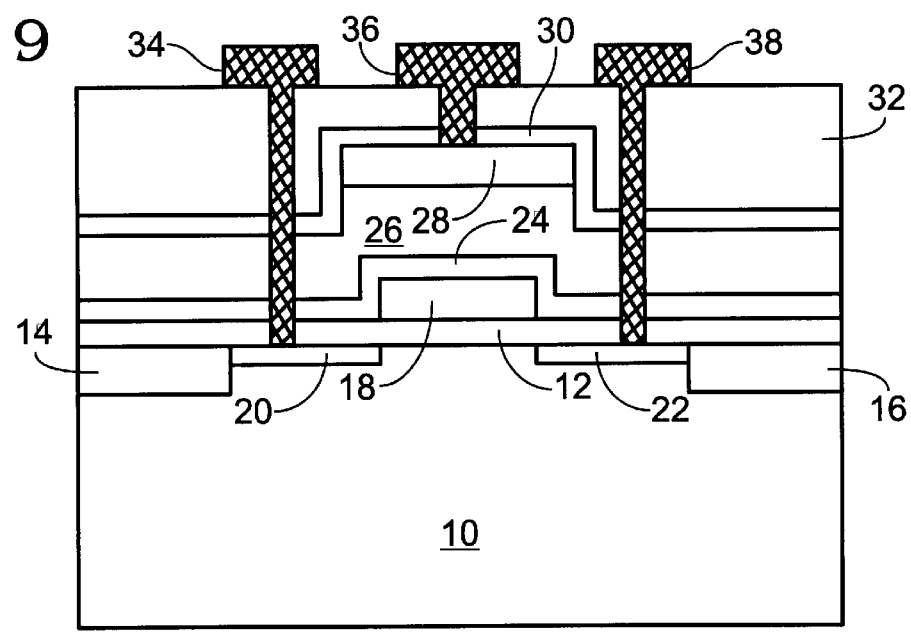
Figure 10:
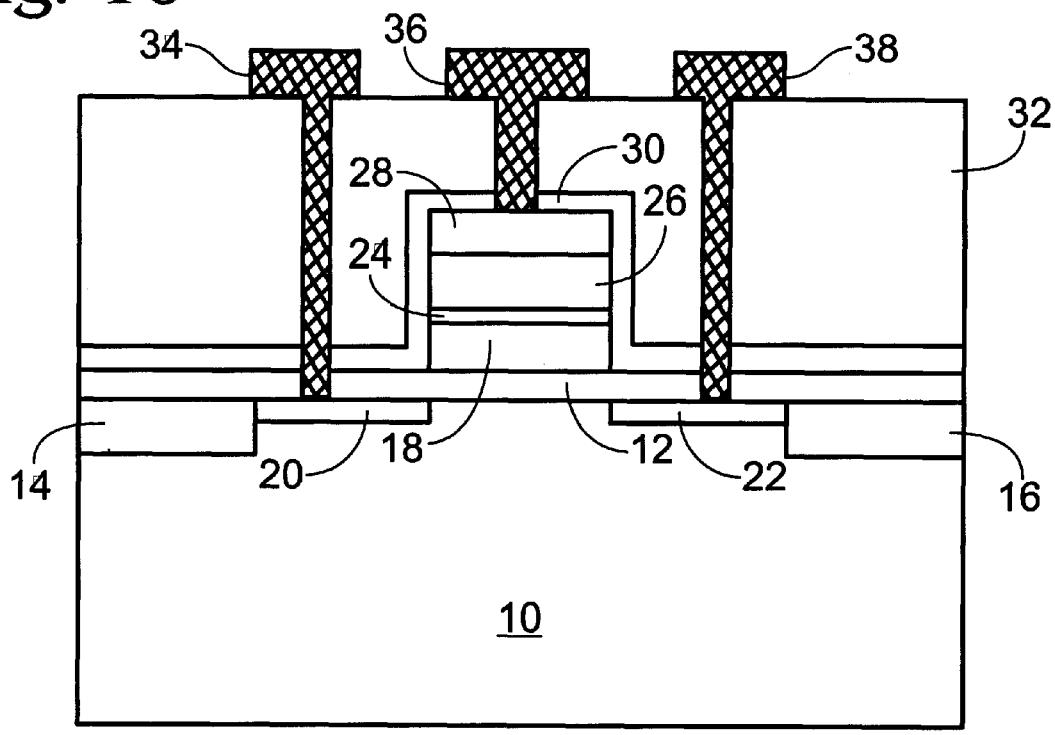

A $H_2$ protective layer 30, such as titanium oxide, aluminum oxide, or silicon nitride, is deposited on the structure of FIG. 5 or 6, as shown in FIG. 7 or 8, respectively. A layer of oxide 32 is deposited by CVD. This layer, and any underlaying layers, are etched to form contact holes, into which metal is deposited for a source electrode 34, a gate electrode 36 and a drain electrode 38, as shown in FIGS. 9 and 10.

ALTERNATE EMBODIMENT

Figure 11:
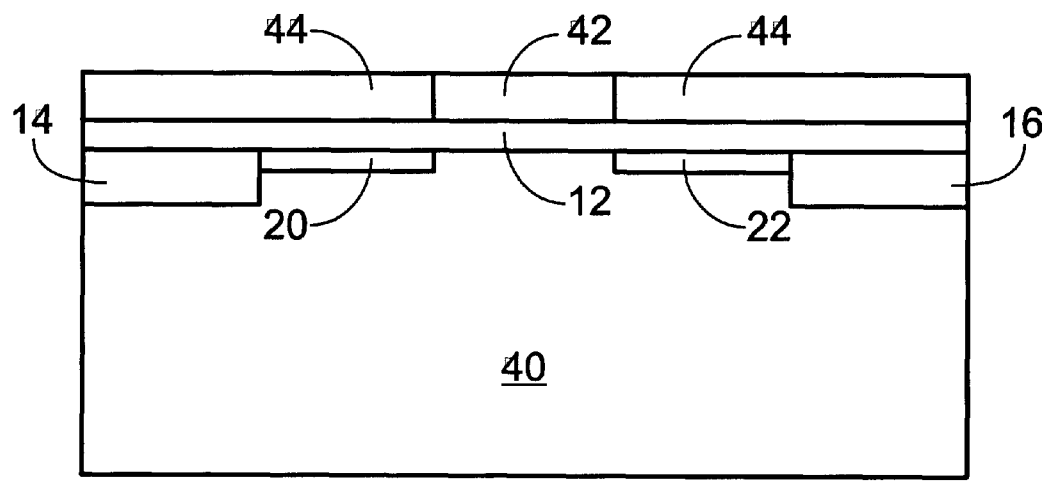
FIGS. 11 to 13 depict successive steps in the fabrication of a single transistor memory device according to an alternate embodiment of the invention.

In the event that material is selected for the bottom electrode, such as platinum, which is more suitable for CMP than plasma etching, the formation of the device is modified as follows, and now referring to FIG. 11, substrate 40 has oxide layer 12, insulator regions 14, 16, and source region 20 and drain region 22 formed thereon. Bottom electrode formation is replaced by depositing either nitride or polysilicon, as replacement electrode 42. After the source regions and drain regions ion implantation and annealing are completed, an oxide layer 44 is deposited by CVD to a thickness greater than that of the replacement electrode, as shown in FIG. 11. The oxide layer is planarized by a chemical-mechanical polishing (CMP) process. Replacement electrode 42 is wet etched to remove the nitride or polysilicon. The gate oxide may also be removed at this time, and replaced with a new thermal or deposited insulator, such as $ZrO_2$, $TiO_2$, or $Al_3O_5$.

Figure 12:
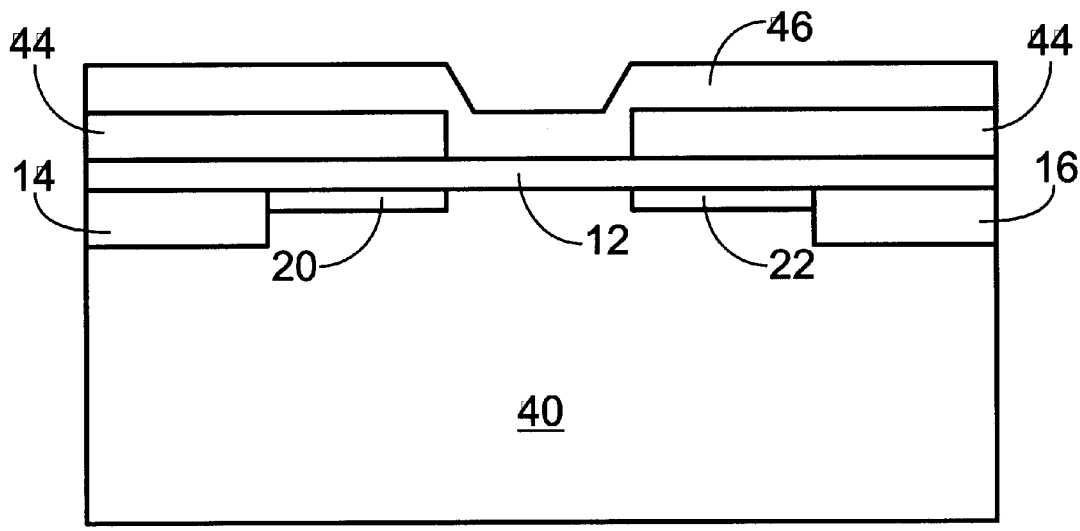
Figure 13:
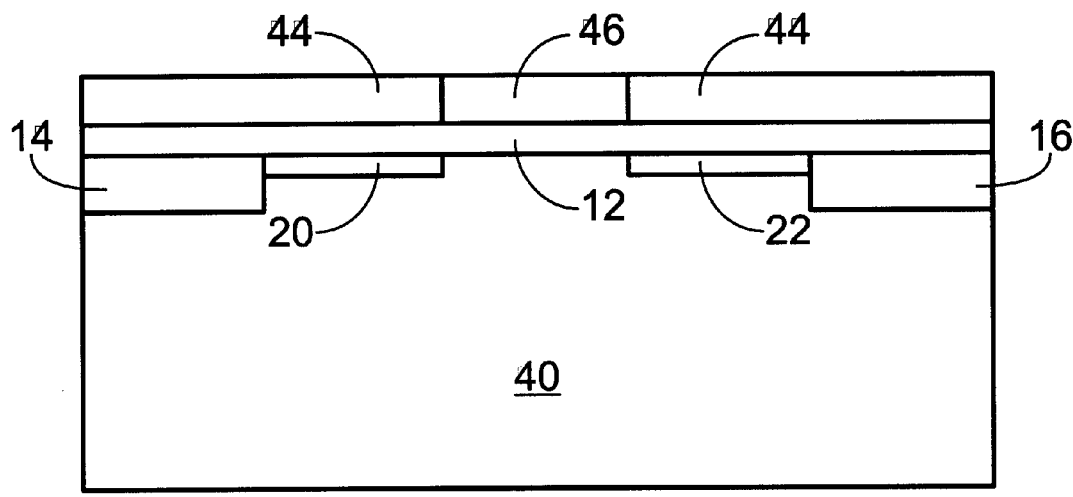

A bottom electrode layer 46 of platinum is deposited by sputtering, as shown in FIG. 12. Bottom electrode layer 46 and oxide layer 44 are thinned by CMP, resulting in the structure shown in FIG. 13. The PGO, or other ferroelectric material, is then deposited by spin-coating, and the remainder of the procedure follows the description of the first embodiment.

The surface smoothness of the MOCVD metal oxide thin film such as PGO, may be further improved by spin coating a thin layer of the same material. The top spin-coating will fill up any voids of the film. Therefore, higher circuit yields can be obtained.

Thus, a method for the MOCVD of metal oxide for a one transistor memory has been disclosed. It will be appreciated that further variations and modifications thereof may be made within the scope of the invention as defined in the appended claims.

We claim:

1. A method of fabricating a one-transistor memory, comprising the steps of:
    preparing a single crystal silicon substrate;
    forming a device area on the substrate;
    growing a gate oxide layer on the surface of the substrate;
    depositing a bottom electrode structure on the gate oxide layer;
    implanting ions to form a source region and a drain region and activating the implanted ions;
    spin coating the structure with a first ferroelectric layer having a thickness of between about 5 nm and 100 nm;
    depositing a second ferroelectric layer to a thickness of between about 50 nm and 300 nm
    annealing the structure to provide a c-axis ferroelectric orientation;
    etching the structure to remove excess ferroelectric material;
    depositing a protective layer;
    depositing a layer of silicon oxide; and
    metallizing the structure.

2. The method of claim 1 wherein said depositing a bottom electrode structure includes depositing a metal layer taken from the group of metals consisting of platinum, iridium and a multiple layered electrode taken from the group of multiple layered electrodes consisting of platinum and iridium on TiN, TaN and TiTaN, by vapor deposition to a thickness of between about 50 nm to 200 nm.

3. The method of claim 1 wherein said depositing a bottom electrode structure includes depositing a layer of replacement material taken from the group of materials consisting of silicon nitride and polysilicon by CVD to a thickness of between about 200 nm to 400 nm; subsequently removing the replacement material and depositing a layer of bottom electrode material taken from the group of material consisting of platinum, iridium and a multiple layered electrode taken from the group of multiple layered electrodes consisting of platinum and iridium on TiN, TaN and TiTaN, by PVD to a thickness of between about 50 nm to 200 nm.

4. The method of claim 3 which include chemically mechanically polishing the structure after said depositing a layer of bottom electrode material.

5. The method of claim 1 wherein said implanting ions to form a source region and a drain region includes implanting ions taken from the group of ions consisting of As ions implanted at an energy level in a range of 40 keV to 90 keV and a dose in a range of $2 \cdot 10^{15}$ cm$^{-2}$ to $5 \cdot 10^{15}$ cm$^{-2}$ and phosphorus ions implanted in an energy level in a range of 30 keV to 60 keV and a dose in a range of $2 \cdot 10^{15}$ cm$^{-2}$ to $5 \cdot 10^{15}$ cm$^{-2}$; and annealing the structure at a temperature of between 700° C. and 950° C. at ambient pressure in an atmosphere taken from the group of atmospheres consisting of argon and nitrogen to activate the implanted ions in the source region and the drain region.

6. The method of claim 1 wherein said spin coating a ferroelectric material includes selecting a ferroelectric material taken from the group of ferroelectric materials consisting of lead germanium oxide (PGO:$Pb_5Ge_3O_{11}$), $SrBi_2Ta_2O_9$(SBT) and $Pb(Zr,Ti)O_3$(PZT).

7. The method of claim 1 wherein said annealing the structure to provide a c-axis ferroelectric orientation includes annealing the structure at a temperature of between 450° C. and 600° C. and at a pressure of 200 torr. to 650 torr. in an oxygen atmosphere.

* * * * *